(12) United States Patent
Ohishi

(10) Patent No.: US 7,027,529 B1
(45) Date of Patent: Apr. 11, 2006

(54) DEMODULATION METHOD AND DEMODULATION APPARATUS

(75) Inventor: Syouji Ohishi, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 507 days.

(21) Appl. No.: 09/639,091

(22) Filed: Aug. 16, 2000

(30) Foreign Application Priority Data

Sep. 13, 1999 (JP) ................................ 11-259316

(51) Int. Cl.
*H03D 3/22* (2006.01)
*H03D 27/22* (2006.01)

(52) U.S. Cl. ........................ 375/329; 375/340; 375/355

(58) Field of Classification Search ................ 375/316, 375/324, 326, 329, 340, 345, 354, 355; 455/232.1, 455/234.1, 245.1; 713/503; 714/700
See application file for complete search history.

(56) References Cited

U.S. PATENT DOCUMENTS

| | | | | | |
|---|---|---|---|---|---|
| 4,667,240 A | * | 5/1987 | Willis et al. | ................. | 348/620 |
| 5,408,698 A | * | 4/1995 | Serizawa et al. | ......... | 455/245.1 |
| 5,440,587 A | * | 8/1995 | Ishikawa et al. | ............ | 375/332 |
| 5,719,862 A | * | 2/1998 | Lee et al. | .................... | 370/355 |
| 5,771,263 A | | 6/1998 | Kanazawa et al. | | |
| 6,336,192 B1 | * | 1/2002 | Sakamoto et al. | .......... | 713/503 |
| 6,415,004 B1 | * | 7/2002 | Fujimura et al. | ............ | 375/324 |
| 6,807,377 B1 | * | 10/2004 | Watanabe | .................... | 398/154 |
| 2002/0027693 A1 | * | 3/2002 | Watanabe | .................... | 359/173 |

FOREIGN PATENT DOCUMENTS

| | | |
|---|---|---|
| JP | 06-188928 | 7/1994 |
| JP | 07-297874 | 11/1995 |
| JP | 09-186729 | 7/1997 |

* cited by examiner

*Primary Examiner*—Jean B. Corrielus
(74) *Attorney, Agent, or Firm*—Arent Fox PLLC

(57) ABSTRACT

A skew detector calculates symbol amplitudes from a first signal ($S_I'$ signal) on an I channel side and a second signal ($S_Q'$ signal) on a Q channel side to be inputted into a carrier reproduction circuit. The skew detector outputs differences between the calculated symbol amplitudes and a predetermined reference amplitude as skew signals. A sine-wave generator generates two orthogonal sine waves from the skew signals which are smoothed via a loop filter. A skew correction unit obtains a multiplied result by multiplying one of the two sine waves (first skew correcting coefficient) and the first signal. The skew correction unit obtains a multiplied result by multiplying the other one of the two sine waves (second skew correcting coefficient) and the second signal. The skew correction unit adds these multiplied results and inputs the added result as a new second signal into the carrier reproduction circuit.

16 Claims, 10 Drawing Sheets

DEMODULATION METHOD AND DEMODULATION APPARATUS

FIELD OF THE INVENTION

The present invention relates to a demodulation method and a demodulation apparatus which orthogonally detect a PSK (Phase Shift Keying) modulated signal with a fixed oscillation frequency so as to demodulate I and Q channel signals in a digital communication technique such as digital satellite broadcasting. More particularly, this invention relates to the demodulation method and the demodulation apparatus which corrects orthogonal skew and unbalanced amplification of the I and Q signals which occur particularly in a detection process of a semi synchronous orthogonal detection circuit so as to reduce deterioration of a demodulation characteristic.

BACKGROUND OF THE INVENTION

Digitization which is the recent tendency deeply spreads into information electric home appliances represented by sound equipments and image equipments. With the development of IC (integrated circuit) and the multimedia where communication and computers are united, the exchange of information between electronic equipments becomes easy. Particularly the digitization of television broadcasting which is a typical information electric home appliance, namely, digital television technique is not only wide-range television techniques such as process, transmission, recording and conversion of image/sound signals according to the digital process but also integrated techniques which makes full use of all the digital techniques such as data compression, code error correction.

Further, the digital television broadcasting has a background of MPEG2 which is a moving picture compressing technique adopted as the standard system in ITU (International Telecommunication Union). This technique makes integrated digital broadcasting including bi-directional data broadcasting and multi-channel by means of band compression possible. Therefore, in order to realize high-definition broadcasting in the digital television technique, it is desired to demodulate the I and Q channel signals which are continued from the prior analog television technique with higher reproducibility. In the case where a modulated signal is transmitted by radio communication via a satellite particularly like the television satellite broadcasting, a radio wave (carrier) is utilized as a carrier wave. Thus, quality of a transmission line in a transmission space is lowered due to weather or another influences, and a receiving state is occasionally deteriorated. Therefore, it is requested to improve reliability and stability of the demodulation process in the demodulation apparatus.

FIG. 1 is a block diagram showing a schematic structure of the prior demodulation apparatus. The demodulation apparatus 100 shown in FIG. 1 demodulates a modulated signal modulated by 4-phase PSK (hereinafter, QPSK). In FIG. 1, the demodulation apparatus 100 is composed of a semi synchronous orthogonal detection circuit 110 as a so-called tuner, A/D converters 131 and 132, a timing reproduction circuit 134, an amplitude comparator 136, a loop filter 138 and a carrier reproduction circuit 140.

The semi synchronous orthogonal detection circuit 110 detects a first signal (hereafter referred to as $S_I$ signal) on an I channel side and a second signal (hereafter referred to as also referred to as $S_Q$ signal) on a Q channel side from the modulated signal. The $S_I$ signal and the $S_Q$ signal are orthogonal. The semi synchronous orthogonal detection circuit 110 is composed of an amplifier 111 at the previous stage, an orthogonal phase detector 120, low-pass filters 113 and 115, and amplifiers 117 and 119 on the after stage. The amplifier 111 amplifies the modulated signal. The orthogonal phase detector 120 orthogonally detects the signals on the I channel side and Q channel side from the modulated signal output from the amplifier 111. The low-pass filters 113 and 115 remove harmonic components of the signals on the I channel side and Q channel side output from the orthogonal phase detector 120. The amplifiers 117 and 119 amplify individually the signals on the I and Q channel sides where their bandwidths are limited.

The orthogonal phase detector 120 is composed of a local oscillator 122, a multiplier 121, a phase shifter 125 and a multiplier 123. The local oscillator 122 oscillates the modulated signal with a fixed frequency (angular frequency: $\omega_c+\omega_d$) which is close to an original carrier wave frequency of the modulated signal (angular frequency: $\omega_c$). The multiplier 121 product-detects the signal on the I channel side from the modulated signal using the oscillation signal (cos $[(\omega_c+\omega_d) t]$) of the local oscillator 122. The phase shifter 125 shifts the phase of the oscillation signal of the local oscillator 122 by $\pi/2$ so as to output the oscillation signal. The multiplier 123 product-detects the signal on the Q channel side from the modulated signal using the oscillation signal $(\sin[(\omega_c+\omega_d) t])$ output from the phase shifter 125.

The A/D converter 131 converts the $S_I$ signal output from the semi synchronous orthogonal detection circuit 110 into an I channel sample signal of a digital value. The A/D converter 132 converts the $S_Q$ signal into a Q channel sample signal of a digital value.

The timing reproduction circuit 134 fetches the $S_I$ signal and the $S_Q$ signal of the digital value from the I and Q channel sample signals output respectively from the A/D converters 131 and 132 with timing which synchronizes a base band signal. The amplitude comparator 136 calculates symbol amplitudes from the $S_I$ signal and the $S_Q$ signal of the digital value and outputs and the $S_Q$ signal of digital values output from the timing reproduction circuit 134. In the carrier reproduction circuit 140, a feedback loop is formed by a complex multiplier 142, a phase comparator 143, a loop filter 144, a numeric-control oscillator 145 and a sine-wave generator 146.

An operation of the demodulation apparatus 100 will be explained below. In FIG. 1, the modulated signal by QPSK is input into the amplifier 111 of the semi synchronous orthogonal detection circuit 110 via a not shown antenna. The modulated signal is amplified by suitable gain in the amplifier 111 so as to be input into the orthogonal phase detector 120.

The modulated signal amplified by the amplifier 111 is input into the multiplier 121 in the orthogonal phase detector 120. The modulated signal is multiplied by the oscillation signal $(\cos[(\omega_c+\omega_d) t])$ output from the local oscillator 122 so that the signal on the I channel is extracted. Similarly, the amplified modulated signal is multiplied by the oscillation signal $(\sin[(\omega_c+\omega_d)t])$ output from the phase shifter 125 so that the signal on the Q channel is extracted.

The signals on the I and Q channel sides output from the orthogonal phase detector 120 are input respectively into the low-pass filters 113 and 115. Their harmonic components are removed and the signals are input into the amplifiers 117 and 119. The signals on the I and Q channel sides input into the amplifiers 117 and 119 are amplified by equal gains so as to signals showing a difference between the calculated symbol amplitudes and a reference amplitude (hereinafter, amplitude difference signals).

FIG. 2 is a block diagram showing a schematic structure of the amplitude comparator in the prior demodulation apparatus. The amplitude comparator 136 has the structure shown in FIG. 2. The signal on the I channel side (here, the $S_I$ signal of digital value) and the signal on the Q channel signal (here, $S_Q$ signal of digital value) are inputted, and their amplitudes are vector-calculated by an amplitude arithmetic section 151 so that the symbol amplitudes are obtained. The signals showing the symbol amplitudes and an inverted signal of the reference amplitude showing the original amplitude of the modulated signal, that is a signal obtained by multiplying the reference amplitude by −1, are added by an addition section 152. Therefore, a difference between the signals showing these amplitudes is output as an amplitude compared result.

The loop filter 138 smoothes the signal showing the amplitude compared result output from the amplitude comparator 136 and inputs the smoothed result into the amplifier 111 of the semi synchronous orthogonal detection circuit 110.

The carrier reproduction circuit 140 corrects a phase difference, mentioned later, so as to extracts an I channel signal (I signal) and a Q channel signal (Q signal) of digital values which are final objects to be acquired from the $S_I$ signal be output as the $S_I$ signal and the $S_Q$ signal. In general, the $S_I$ signal and the $S_Q$ signal are represented by the following equations by using the I channel signal (I(t)) and the Q channel signal (Q(t)) which should be finally demodulated.

$$S_I = I(t)\cos(\omega_d t) - Q(t)\sin(\omega_d t) \quad (1)$$

$$S_Q = Q(t)\cos(\omega_d t) + I(t)\sin(\omega_d t) \quad (2)$$

As understood from the oscillation angular frequency ($\omega_c + \omega_d$) of the local oscillator, $\omega_d$ shows the difference between the angular frequency of the carrier wave and the angular frequency of the local oscillator.

The $S_I$ signal and the $S_Q$ signal are then input into the A/D converters 131 and 312 so as to be sampled and made to the quantum. These signals are converted respectively into the I channel sample signal and the Q channel sample signal of digital value. The I and Q channel sample signals are input into the timing reproduction circuit 134 and extracted at timing which synchronizes with a clock (symbol rate) of the base band signal so as to be outputted.

The signals on the I and Q channel sides of digital value output from the timing reproduction circuit 134 are input into the amplitude comparator 136 and further into the complex multiplier 142 of the carrier reproduction circuit 140. The signals on the I and Q channel sides input into the amplitude comparator 136 are input into the amplitude arithmetic section 151 so that the symbol amplitudes are calculated and the differences with the reference amplitude are calculated by the addition section 152. The calculated results are output as the amplitude compared results so as to be input into the loop filter 138 at the next stage.

The loop filter 138 smoothes the signals showing the amplitude compared results and inputs the results as control signals which can change the gains into the amplifier 111 of the semi synchronous orthogonal detection circuit 110. As a result, the semi synchronous orthogonal detection circuit 110, the A/D converters 131 and 132, the timing reproduction circuit 134, the amplitude comparator 136 and the loop filter 138 form the feedback loop. The symbol amplitudes, which are determined by the signals on the I and Q channel sides output from the timing reproduction circuit 134, are converged on the reference amplitude.

On the other hand, the signals on the I and Q channel sides, which are input into the complex multiplier 142 of the carrier reproduction circuit 140, are used for complex multiplication according to the following equations together with a cos ($\omega_r t$) signal and a sin ($\omega_r t$) signal of the angular frequency $\omega_r$ output from the sine-wave generator 146, mentioned later. These signals are output as signals I' (t) and Q' (t).

$$I'(t) = S_I \cos(\omega_r t) + S_Q \sin(\omega_r t) \quad (3)$$

$$Q'(t) = S_Q \cos(\omega_r t) - S_I \sin(\omega_r t) \quad (4)$$

The signals I' (t) and Q' (t) output from the complex multiplier 142 are input into the phase comparator 143. The phase comparator 143 outputs a signal (hereinafter, phase difference signal) which is in accordance with a phase difference between these two signals. The phase difference signal output from the phase comparator 143 is smoothed in the loop filter 144 so as to be output as a signal showing an average value of a change amount in unit time (hereinafter, phase difference average signal).

The phase difference average signal output from the loop filter 144 is input into the numeric-control oscillator 145. The numeric-control oscillator 145 generates a signal corresponding to the phase difference average signal, namely, $\omega_r t$ shown in the equations (1) and (2). The signal generated in the numeric-control oscillator 145 is input into the sine-wave generator 146. The sine-wave generator 146 inputs the $\cos(\omega_r t)$ signal and the $\sin(\omega_r t)$ signal of the angular frequency $\omega_r$ into the complex multiplier 142.

Therefore, the feedback loop is formed in the carrier reproduction circuit 140. The oscillation angular frequency $\omega_r$ of the sine-wave generator 146 is converged so as to coincide with the oscillation angular frequency $\omega_d$ of the $S_I$ signal and the $S_Q$ signal obtained from the timing reproduction circuit 134. More concretely, as is clear from the following equations obtained from the above equations (1) to (4), the angular frequency $\omega_r$ converges on $\omega_d$. The signals I' (t) and Q' (t) obtained from the complex multiplier 142 become the original I channel signal (I(t) signal) and the Q channel signal (Q(t) signal) included in the modulation signal. Therefore, the objective modulation of the I and Q channel signals is achieved.

$$I' = S_I \cos(\omega_r t) + S_Q \sin(\omega_r t) = I(t)\cos((\omega_d - \omega_r)t) - Q(t)\sin((\omega_d - \omega_r)t) \quad (5)$$

$$Q' = S_Q \cos(\omega_r t) - S_I \sin(\omega_r t) = I(t)\sin((\omega_d - \omega_r)t) + Q(t)\cos((\omega_d - \omega_r)t) \quad (6)$$

FIG. 3A is a diagram showing the operation of the prior demodulation apparatus. This is constellation of QPSK obtained in the ideal demodulation. Namely, in the case where the angular frequency $\omega_r$ converges on $\omega_d$ in the equations (5) and (6), the symbols which are determined by the I and Q channel signals output from the complex multiplier 142 are specified on four positions as shown in FIG. 3A. These four positions shift by $\pi/2$ in the first to fourth quadrants, and shift by $\pi/4$ with respect to I and Q axes.

However, actually it is difficult to tightly hold the set phase amount in the phase shifter 125 of the semi synchronous orthogonal detection circuit 110. Normally, the phase amount slightly deviates from an objective value. For example, in the case where the phase amount $\pi/2$ deviates by θ [rad] in the phase shifter 125 shown in FIG. 1, the $S_I$ and $S_Q$ signals output from the amplifiers 117 and 119 are also different from the results shown in the equations (1) and (2). Therefore, these signals are represented by the following equations.

$$S_I = I(t)\cos(\omega_d t) - Q(t)\sin(\omega_d t) \quad (7)$$

$$S_Q = Q(t)\cos(\omega_d t + \theta) + I(t)\sin(\omega_d t + \theta) \quad (8)$$

Further, when these signals are subject to the complex arithmetic in the complex multiplier 142, results represented by the following equations are obtained.

$$I' = (t)[\cos(\omega_d t)\cos(\omega_r t) + \sin(\omega_d t + \theta)\sin(\omega_r t)] + Q(t)[\cos(\omega_d t + \theta)\sin(\omega_r t) - \sin(\omega_d t)\sin(\omega_r t)] \quad (9)$$

$$Q' = I(t)[\sin(\omega_d t + \theta)\cos(\omega_r t) - \cos(\omega_d t)\sin(\omega_r t)] + Q(t)[\sin(\omega_d t)\sin(\omega_r t) + \cos(\omega_d t + \theta)\sin(\omega_r t)] \quad (10)$$

Therefore, even if $\omega_r = \omega_d$ is obtained by the feedback loop of the carrier reproduction circuit 140, the I' and Q' signals do not coincide with the I(t) and Q(t) signals. Thus, these symbols appear as orthogonal skew. FIG. 3B is a diagram of the constellation in this case. The symbols appear in positions which rotate around the symbols on the constellation (FIG. 3A) without skew. Therefore, there is a problem that the BER (Bit Error Rate) characteristic after the demodulation is deteriorated due to the orthogonal skew in the prior demodulation apparatus.

Further, if the gains of the amplifiers 117 and 119 which amplify the I and Q channel signals after the orthogonal phase detection are different from each other in the semi synchronous orthogonal detection circuit 110, the above skew occurs. Therefore, the constellation which is similar to that of FIG. 3B appears, and the demodulation characteristic is deteriorated.

This is caused by the following reason. The feedback loop formed by the amplitude comparator 136 and the loop filter 138 just utilizes the results (symbol amplitudes), which are obtained by the vector arithmetic of the amplitudes of the signals on the I and Q channel sides output from the timing reproduction circuit 134, as the signal which can change the gain of the amplifier 111 of the semi synchronous orthogonal detection circuit 110. The results do not correct shift of the characteristic between the amplifiers 117 and 119.

Further, in order to solve these problems, a comparatively large-sized equalizer circuit should be provided. Therefore, the circuit configuration becomes complicated, and this increases the cost.

SUMMARY OF THE INVENTION

It is an object of the invention to detect a skew amount from signals on I and Q channel sides after being passed through a timing reproduction circuit and correct orthogonal skew and a difference in amplitude between the signals on the I and Q channel sides so as to reduce deterioration of a demodulation characteristic due to the skews.

According to one aspect of this invention, when an I channel signal and a Q channel signal which are obtained from a PSK modulated signal by a semi synchronous detection system are demodulated, a skew detector calculates symbol amplitudes from a first signal on the I channel side and a second signal on the Q channel signal to be inputted into a carrier reproduction circuit, and outputs differences between the calculated symbol amplitudes and a predetermined reference amplitude as skew signals. A sine-wave generator generates two orthogonal sine waves from the skew signals smoothed via a loop filter. A skew correction device multiplies one (first skew correcting coefficient) of the two sine waves and the first signal so as to obtain a multiplied result and multiplies the other one (second skew correcting coefficient) of the two sine waves and the second signal so as to obtain a multiplied result. The skew correction device adds these multiplied results and inputs the added result as a new second signal into the carrier reproduction circuit.

Therefore, a feedback loop, which is composed of the skew correction device, the skew detector, the loop filter and the sine-wave generator, is formed at the previous stage of the carrier reproduction circuit. The feedback loop circuit detects skew of the Q channel signal which occurs in a phase shifter required for the orthogonal detection and can obtain the second signal where the detected skew is corrected. As a result, the second signal which is the corrected result is inputted into the carrier reproduction circuit so that the influence of the skew can be eliminated in a process of the carrier reproduction circuit and the processes thereafter.

According to another aspect of this invention, an amplitude difference comparator calculates a difference between a first signal on an I channel side and a second signal on a Q channel side to be inputted into a timing reproduction circuit which extracts a signal with timing in synchronization with a base band signal. An amplifier amplifies one (hereinafter a first channel signal) of the first signal and the second signal by means of a gain according to a signal showing the difference smoothed via a loop filter. The amplifier inputs the amplified result as a new first channel signal into the timing reproduction circuit.

Therefore, a feedback loop, which is composed of the amplifier, the amplitude difference comparator and the loop filter, is formed at the previous stage of the timing reproduction circuit. The feedback loop circuit adjusts a level of one of the first signal and the second signal such as sample values of the I and Q channels output from A/D converters so that both the signals are equal. As a result, even if gains are different from each other in amplifiers which individually amplifies the signals on the I and Q channel sides which have been just subject to the orthogonal phase detection, the influence of the skew due to the difference in the gains can be eliminated in the process of the timing reproduction circuit and the processes thereafter.

Other objects and features of this invention will become apparent from the following description with reference to the accompanying drawings.

DESCRIPTION OF THE PREFERRED EMBODIMENTS

Preferred embodiments of a demodulation method and a demodulation apparatus of the present invention will be explained below with reference to the accompanying drawings. The invention is not limited to these embodiments.

The demodulation method and the demodulation apparatus according to a first embodiment will be explained below. The demodulation method and the demodulation apparatus according to the first embodiment have the following characteristic in addition to the characteristic of the prior demodulation apparatus 100. That is, orthogonal skew is detected based on the I and Q channel signals output from the timing reproduction circuit 134, and the detected orthogonal skew is corrected. The corrected result is input into the carrier reproduction circuit 140 so as to achieve accurate reproduction of a demodulated signal without being influenced by the orthogonal skew, namely, the phase delay θ of the phase shifter 125.

Figure 1:
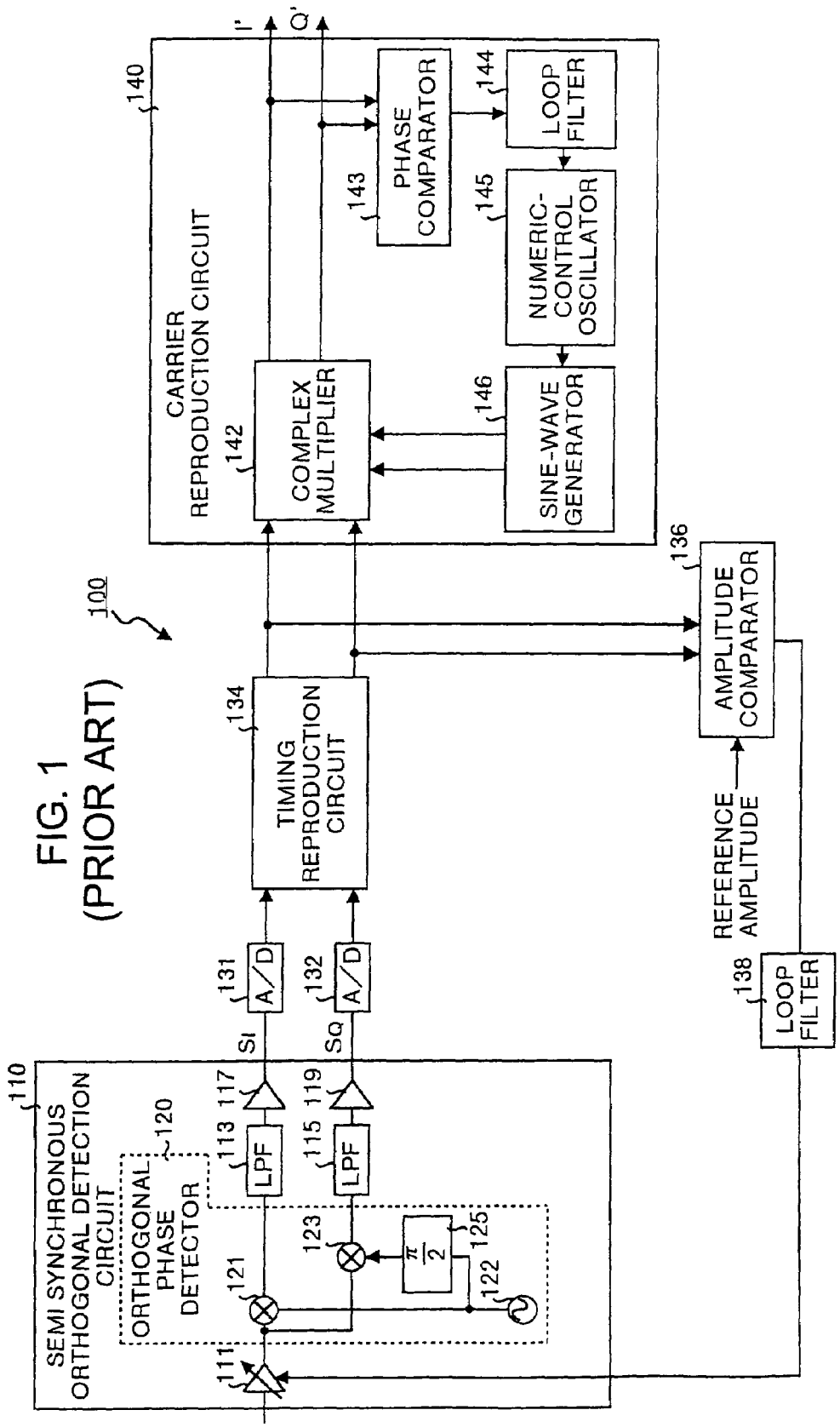
FIG. 1 is a block diagram showing a schematic structure of a prior demodulation apparatus.
Figure 4:
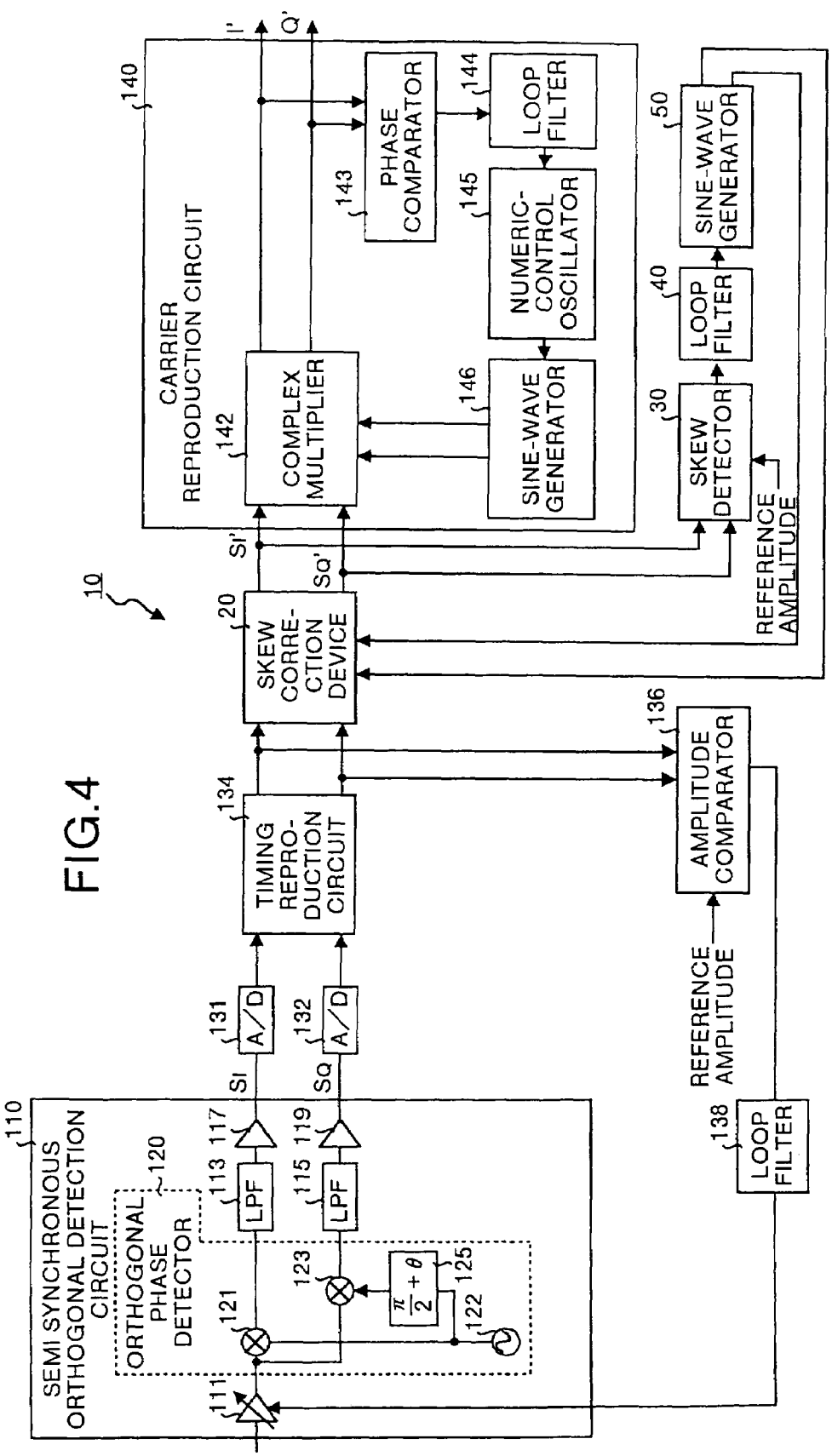
FIG. 4 is a block diagram showing a schematic structure of a demodulation apparatus according to a first embodiment of the present invention.

FIG. 4 is a block diagram showing a schematic structure of the demodulation apparatus according to the first embodiment. The demodulation apparatus 10 shown in FIG. 4 is provided with a feedback loop circuit between the timing reproduction circuit 134 and the carrier reproduction circuit 140. The feedback loop circuit is composed of a skew correction device 20, a skew detector 30, a loop filter 40 and a sine-wave generator 50. This is different from the prior demodulation apparatus 100. Components that are same or perform similar functions to those of the prior demodulation apparatus 100 shown in FIG. 1 are provided with the same legends and their explanation will be omitted.

Figure 3A:
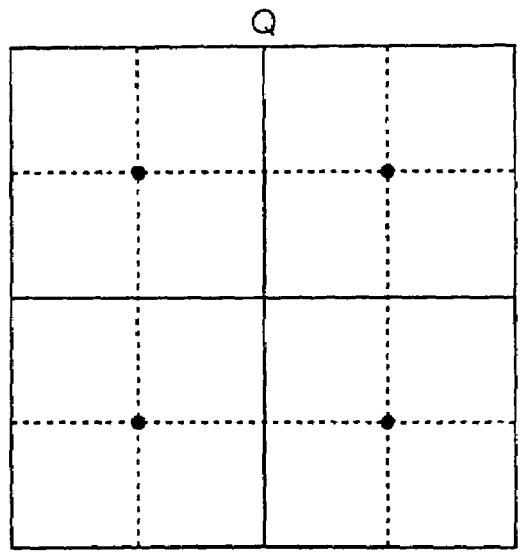
FIG. 3A and FIG. 3B are diagrams showing an operation of the prior demodulation apparatus.
Figure 3B:
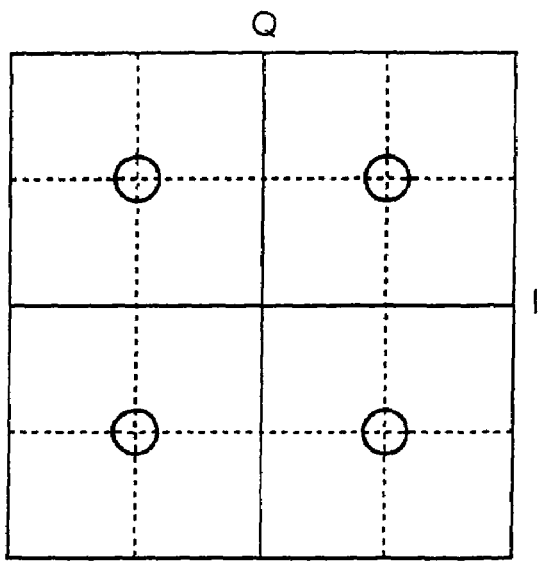

In FIG. 4, the skew correction device 20 corrects the orthogonal skew based on the respective signals on the I and Q channel sides output from the timing reproduction circuit 134 and a sine-wave signal output from the sine-wave generator 50, mentioned later. The skew correction device 20 outputs I and Q channel signals to be demodulated finally, that are signals which obtain ideal constellation shown in FIG. 3A.

Figure 5:
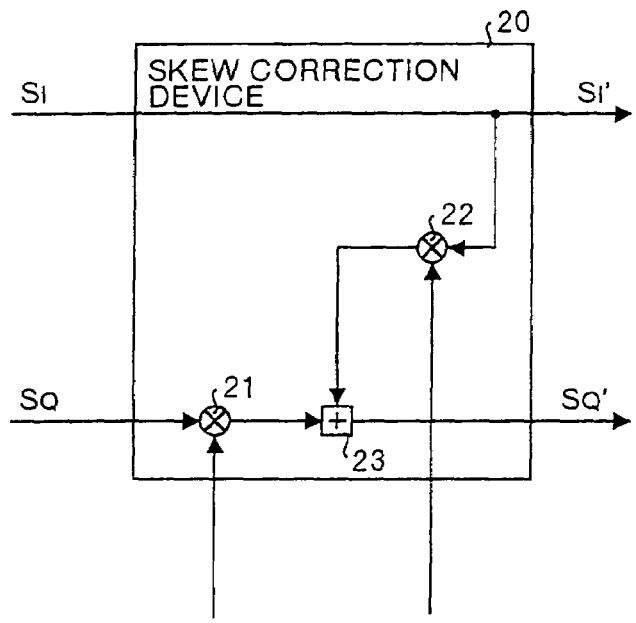
FIG. 5 is a block diagram showing a schematic structure of a skew correction device of the demodulation apparatus according to the first embodiment.

FIG. 5 is a block diagram showing a schematic structure of the skew correction device of the demodulation apparatus according to the first embodiment. As shown in FIG. 5, the skew correction device 20 outputs the first signal (hereafter referred to as $S_I$ signal) on the I channel side received from the timing reproduction circuit 134 as it is as first signal (hereafter referred to as $S_I'$ signal). On the other hand, inputs the second signal (hereafter referred to as $S_Q$ signal) on the Q channel side into a multiplication section 21.

The multiplication section 21 receives the $S_Q$ signal as well as a sine-wave signal (cos wave) outputted from the sine-wave generator 50, mentioned later, as a skew correcting coefficient. The multiplication section 21 multiplies these input signals and outputs the multiplied result. The multiplied result outputted from the multiplication section 21 is input into an addition section 23. The $S_I$ signal is also input into a multiplication section 22. The multiplication section 22 inputs the $S_I$ signal as well as a sine-wave signal (sin wave) output from the sine-wave generator 50, mentioned later, as a skew correcting coefficient. The multiplication section 22 multiplies these input signals and outputs the multiplied result.

The addition section 23 adds the multiplied result output from the multiplication section 22 to the multiplied result output from the multiplication section 21 and outputs the added result as an $S_Q'$ signal. Namely, in the case where the phase delay θ occurs in the phase shifter 125, as shown in the equation (8), only the signal on the Q channel side of the signals on the I and Q channel sides output from the timing reproduction circuit 134 is influenced by the phase delay θ. The skew correction device 20 corrects skew in the signal on the Q channel side using the skew correcting coefficient.

The $S_I'$ and $S_Q'$ signals output from the skew correction device 20 are input into the complex multiplier 142 of the carrier reproduction circuit 140 and further into the skew detector 30. The skew detector 30 detects the output of the skew correction device 20, namely, a skew amount of the symbols from the $S_I'$ and $S_Q'$ signals.

Figure 6:
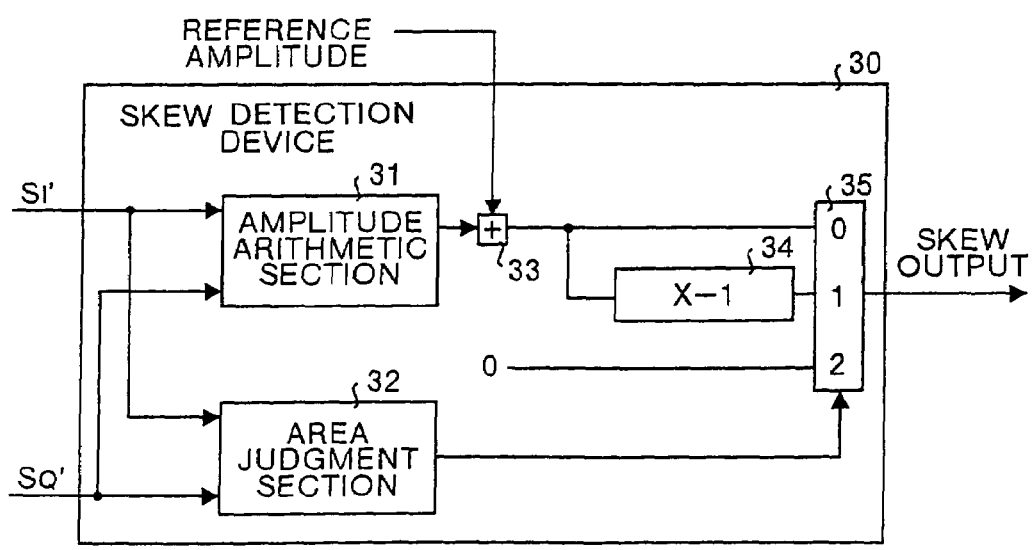
FIG. 6 is a block diagram showing a schematic structure of a skew detector of the demodulation apparatus according to the first embodiment.

FIG. 6 is a block diagram showing a schematic structure of the skew detector of the demodulation apparatus according to the first embodiment. As shown in FIG. 6, the skew detector 30 inputs both the $S_I'$ and $S_Q'$ signals into an amplitude arithmetic section 31 and an area judgment section 32. The amplitude arithmetic section 31 vector-calculates the amplitudes of the input $S_I'$ and $S_Q'$ signals so as to obtain symbol amplitudes. The area judgment section 32 judges areas where the symbols of the $S_I'$ and $S_Q'$ signals are positioned in an IQ space, and outputs a signal according to the judged areas.

Figure 2:
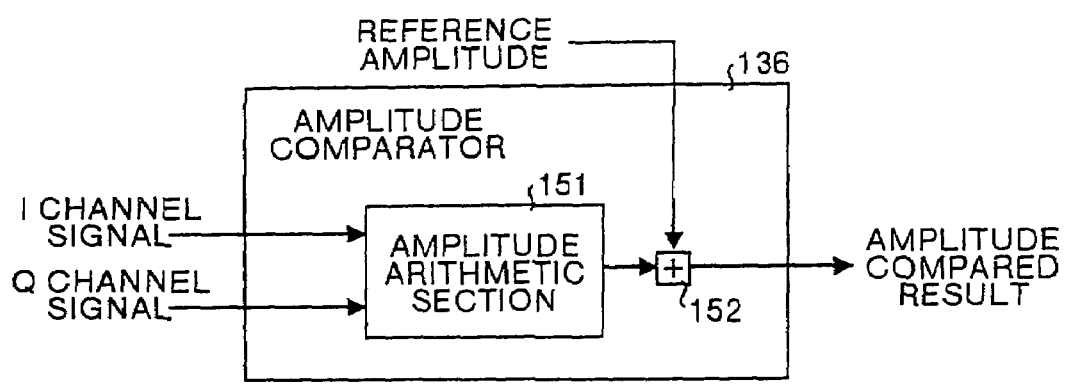
FIG. 2 is a block diagram showing a schematic structure of an amplitude comparator in the prior demodulation apparatus.

The calculated result output from the amplitude arithmetic section 31, namely, the signal showing the symbol amplitudes are input into an addition section 33. The addition section 33 adds a reference amplitude that original amplitude of the symbol obtained from the modulated signal is shown by a negative code to the symbol amplitude. Thus, the addition section 33 outputs a difference of the amplitude as the amplitude compared result. The structure composed of the amplitude arithmetic section 31 and the addition section 33 has the function which is the same as that of the amplitude comparator 136 shown in FIG. 2.

The amplitude compared result output from the addition section 33 is input into a selector 35 and a signal inversion section 34. The signal inversion section 34 outputs a signal obtained by inverting the amplitude compared result, that is a signal obtained by multiplying the amplitude compared result by −1. The inverted signal is input into the selector 35. The selector 35 selects the amplitude compared result output from the addition section 33, the inverted signal of the amplitude compared result output from the signal inversion section 34 or a signal showing a special output according to a selection signal. The selector 35 outputs the selected signal as skew output. The selection signal is output from the area judgment section 32.

The skew detector 30 outputs a signal which shows the difference between the symbol amplitude of the $S_I'$ and $S_Q'$ signals and the reference amplitude, a signal which is obtained by inverting the code of the difference signal, or a signal which shows special output, as the skew output according to the areas in the IQ space of the symbol determined from the $S_I'$ and $S_Q'$ signals.

As for the concrete judgment made by the area judgment section 32 is as follows. When the symbol amplitude is positioned in a specified area in the second or fourth quadrant of the IQ space, the area judgment section 32 outputs a signal showing "0". When the symbol amplitude is positioned in a specified area in the first or third quadrant, the area judgment section 32 outputs a signal showing "1". When the symbol amplitude is positioned in another area, the area judgment section 32 outputs a signal showing "2". In this case, the selector 35 outputs the signal showing the amplitude compared result, the inverted signal of the amplitude compared result and the signal of special value (may be zero but another value is preferable) successively in the case where the signal output from the area judgment section 32 shows "0", "1" or "2".

Figure 7:
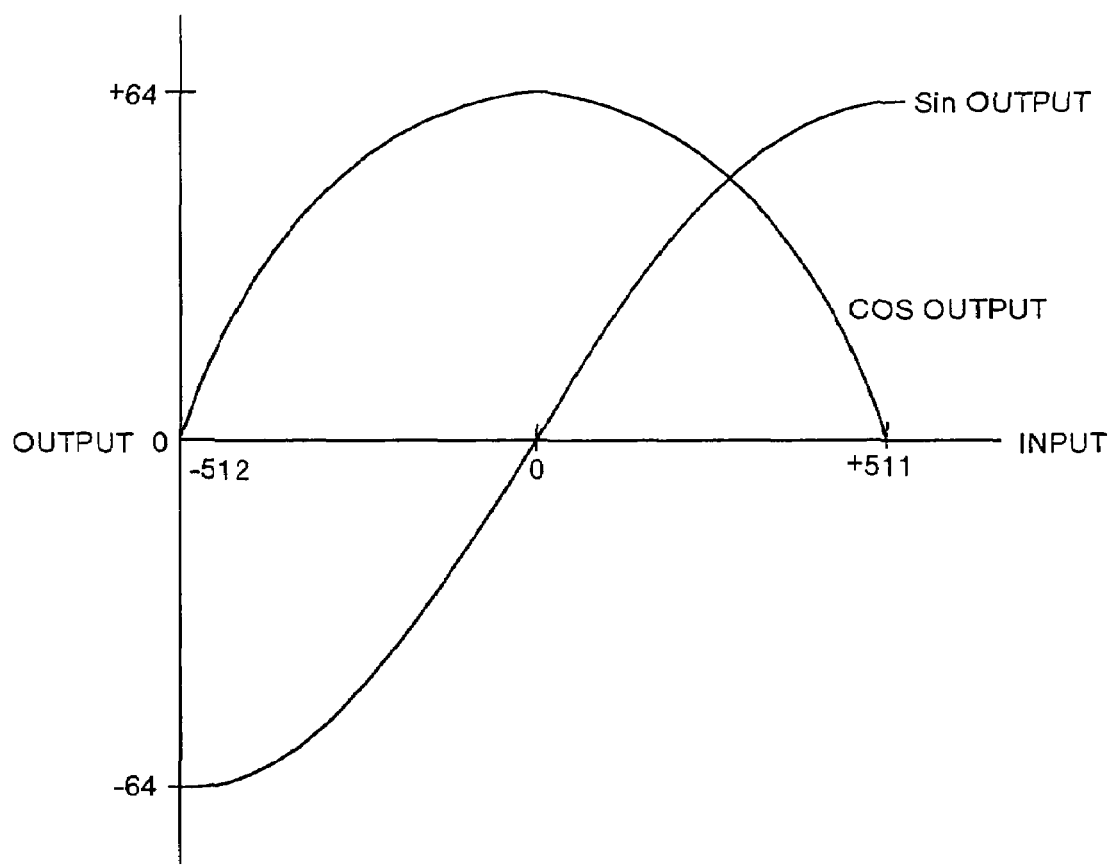
FIG. 7 is a diagram showing an operation of a sine-wave generator in the demodulation apparatus according to the first embodiment.

The skew output from the skew detector 30 is input into the loop filter 40 so as to be smoothed. The output of the loop filter 40 is input into the sine-wave generator 50 so as to converted into orthogonal two sine waves. FIG. 7 is a diagram showing an operation of the sine-wave generator in the demodulation apparatus according to the first embodiment.

In the graph shown in FIG. 7, a horizontal axis shows input from the loop filter 40. For example, when a signal showing "+511" is input into the sine-wave generator 50, a cos wave and sin wave of +90° are output. When a signal showing "−512" is input, a cos wave and sin wave of −π/2 [rad] are output.

An instantaneous value according to the signal showing the range of +511 to −512 in the sine wave is thus output. In this example, the range of the amplitude which is the instantaneous value is −64 to +64. The sine-wave generator 50 does not generate a signal of $2\pi$ [rad] which is the whole phase range unlike the sine-wave generator 146 and generates a signal of $\pi$ [rad] which is the half of the $2\pi$ [rad].

The two sine waves output from the sine-wave generator 50, namely, the cos wave and sin wave are fed back as the skew correcting coefficient to the skew correction device 20. Therefore, the feedback loop is formed.

An operation of the demodulation apparatus 10 will now be explained below. The explanation is omitted for the flow of the signal flow from that the modulated signal is input into the semi synchronous orthogonal detection circuit 110 to that the signals on the I and Q channel sides are extracted in the timing reproduction circuit 134, as it is mentioned above. The operation of the feedback loop circuit composed of the skew correction device 20, the skew detector 30, the loop filter 40 and the sine-wave generator 50 will be mainly explained.

In FIG. 4, plus phase delay θ, for example, occurs in the phase shifter 125 of the orthogonal phase detector 120, namely, the signals shown in the equations (7) and (8) are output as the signals on the I and Q channel sides from the timing reproduction circuit 134. In this case, the skew detector 30 inputs the $S_I'$ and $S_Q'$ signals which have passed through the skew correction device 20 thereinto so as to output the minus signal as the skew output as mentioned below.

Figure 8A:
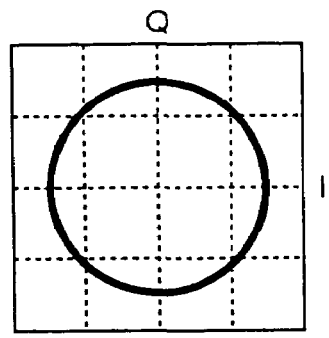
FIG. 8A to FIG. 8C are diagrams showing an operation of the demodulation apparatus according to the first embodiment.
Figure 8B:
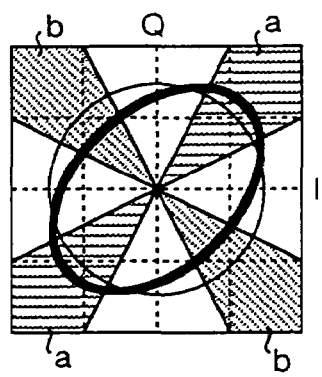
Figure 8C:
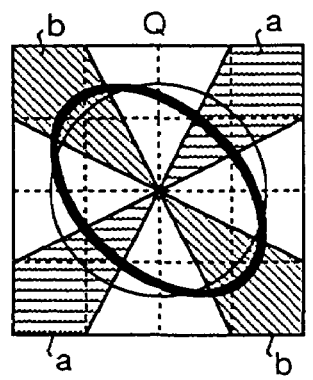

FIG. 8A to FIG. 8C are diagrams showing the operation of the demodulation apparatus according to the first embodiment. Particularly they show constellation of the symbols of the $S_I'$ and $S_Q'$ signals output from the timing reproduction circuit 134. FIG. 8A shows the ideal constellation of the symbol when the phase delay θ does not occur, namely, θ=0.

FIG. 8B shows the constellation (thick line) when the phase delay θ is plus. FIG. 8C shows the constellation (thick line) when the phase delay θ is minus. In FIG. 8B and FIG. 8C, thin lines show the ideal constellation shown in FIG. 8A.

Therefore, this example corresponds to FIG. 8B when the phase delay ♭ is plus. Particularly in FIG. 8B and FIG. 8C, areas, which are determined from predetermined angles formed by two straight lines connecting the symbol positions on the ideal constellation shown in FIG. 3A (four symbol positions which shift by π/2 and shift by π/4 with respect to the I and Q axes) and the origin of the IQ space, become the specified areas. These areas correspond to the specified areas a and b in the drawings.

Therefore, in the case where the symbol of the $S_I'$ and $S_Q'$ signals is positioned in the specified area b of the second or fourth quadrant in the IQ space in FIG. 8B, the reference amplitude (thin line) has a larger value than that of the symbol amplitude (thick line) of the $S_I'$ and $S_Q'$ signals due to the plus phase delay in the area b. The amplitude compared result by the addition section 33 shown in FIG. 6 shows a minus value. In this case, as for the signal output from the area judgment section 32, the signal "0" showing the specified area b is output. The selector 35 outputs the signal of minus value which is the output of the addition section 33 directly as the skew output.

On the other hand, in the case where the symbol of the $S_I'$ and $S_Q'$ signals is positioned in the specified area a of the first or third quadrant in the IQ space, the symbol amplitude (thick line) of the $S_I'$ and $S_Q'$ signals shows a larger value than that of the reference amplitude (thin line). As a result, a plus value is output as the amplitude compared result by the addition section 33. However, in this case, the signal "1" showing the specified area a is output as the signal output from the area judgment section 32. The selector 35 selects the inverted signal of the output of the addition section 33 so as to output a minus value signal as the skew output ultimately.

Therefore, in the case where the phase delay θ showing plus value occurs, a signal corresponding to a difference between the calculated symbol amplitude and the reference amplitude is output as a negative signal from the skew detector 30. Similarly, in the case where negative phase delay θ occurs, the skew output from the skew detector 30 is a plus signal. In the case where the symbol is not positioned in the specified area a nor b, the signal "2" is output from the area judgment section 32. A signal of special value is output as the skew output via the selector 35.

The skew output showing negative signal is smoothed in the loop filter 40, and the negative signal is input into the sine-wave generator 50. When a value corresponding to the signal input into the sine-wave generator 50, namely, a value on the horizontal axis on the graph shown in FIG. 7 is α, the two sine waves output from the sine-wave generator 50 can be represented as cos α and sin α. In this case, the $S_Q'$ signal output from the skew correction device 20 can be represented as $S_Q' = S_Q \cos\alpha + S_I \sin\alpha$ according to the structure of the skew correction device 20. However, this is based on a result gotten from the following equation.

In order to eliminate the phase delay θ in the equation (8), as shown in the following equation, phase α is introduced and a value of α which satisfies α=−θ may be input into the sine-wave generator 50.

$$S_Q'=Q(t)\cos(\omega_d t+\theta+\alpha)+I(t)\sin(\omega_d t+\theta+\alpha) \quad (11)$$

When the equation (11) is modified, the following equation is obtained.

$$S_Q'=[Q(t)\cos(\omega_d t+\theta)+I(t)\sin(\omega_d t+\alpha)]\cos\alpha+[I(t)\cos(\omega_d t)-Q(t)\sin(\omega_d t)]\cos\theta-[Q(t)\cos(\omega_d t)+I(t)\sin(\omega_d t)\sin\theta]\sin\alpha \quad (12)$$

Further, when assuming the case where the phase delay θ is small is, and cos θ=1 and sin θ=0, the above equation (12) is shown as follows.

$$S_Q'=[Q(t)\cos(\omega_d t+\theta)+I(t)\sin(\omega_d t+\alpha)]\cos\alpha+[I(t)\cos(\omega_d t)-Q(t)\sin(\omega_d t)]\sin\alpha=S_Q\cos\alpha+S_I\sin\alpha \quad (13)$$

The deduced result means that the skew correction can be achieved by performing the operation represented by the equation (13) in the skew correction device 20. Therefore, when the value of the loop filter 40 becomes suitable by means of the above operation, the output of the skew detector 30, namely, the amplitude compared result becomes zero. As a result, the skew correction is completed.

In the demodulation apparatus 10 shown in FIG. 4, the signals on the I and Q channels output from the timing reproduction circuit 134 are input into the amplitude comparator 136. The amplitude comparator 136 compares the amplitudes in order to obtain the feedback input signal into the semi synchronous detection circuit 110. However, the $S_I'$ and $S_Q'$ signals output from the skew correction device 20 may be input into the amplitude comparator 136. In this case, since the I and Q channel signals which have been subject to the skew correction are used for the amplitude comparison, the gain of the amplifier 111 can be changed more effectively and with high reliability. Further, in this case, the amplitude compared result obtained from the addition section 33 of the skew detector 30 is input directly into the loop filter 138 so that the amplitude comparator 136 can be eliminated.

In the modulation apparatus 10 according to the first embodiment, orthogonal skew which occurs in the phase shifter 125 of the orthogonal phase detector 120 is detected by the feedback loop circuit based on the I and Q channel signals output from the timing reproduction circuit 134. The feedback loop circuit is composed of the skew correction device 20, the skew detector 30, the loop filter 40 and the sine-wave generator 50. The feedback loop circuit corrects detected orthogonal skew, and inputs the corrected result into the carrier reproduction circuit 140. Therefore, the influence of the phase delay θ in the phase shifter 125 is eliminated, and the deterioration of the demodulation characteristic caused by the orthogonal skew can be reduced.

There will be explained below the demodulation method and the demodulation apparatus according to the second embodiment. The demodulation apparatus 10 according to the first embodiment corrects the skew which is caused by the phase delay which occurs in the phase shifter 125 of the semi synchronous orthogonal detection circuit 110. However, when the gains between the amplifiers 117 and 119 of the semi synchronous orthogonal detection circuit 110 are different, there arises a problem that the constellation which is similar to FIG. 8B or 8C appears. In order to solve this problem, the demodulation apparatus according to the second embodiment corrects a difference between the gains of the amplifiers 117 and 119 in addition to the correction of the phase delay. Therefore, more accurate reproduction of the demodulated signal is achieved.

Figure 9:
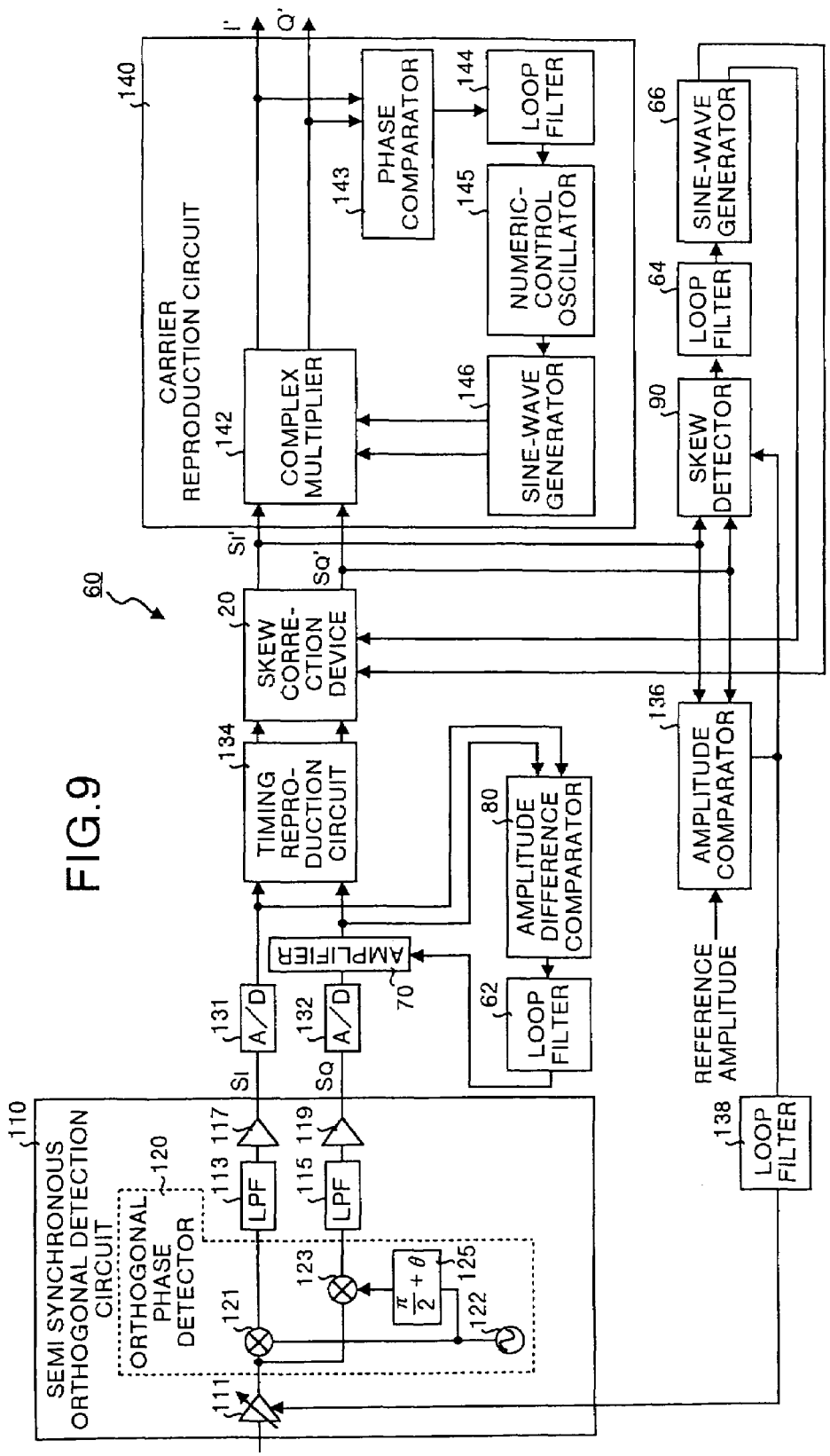
FIG. 9 is a block diagram showing a schematic structure of the demodulation apparatus according to a second embodiment of the present invention.

FIG. 9 is a block diagram showing a schematic structure of the demodulation apparatus according to the second embodiment. The demodulation apparatus 60 shown in FIG. 9 is provided with a feedback loop circuit between the A/D converter 132 and the timing reproduction circuit. The A/D converter 132 converts the signal ($S_Q$) on the Q channel side output from the semi synchronous orthogonal detection circuit 110 into a digital signal. This feedback loop circuit is composed of an amplifier 70, an amplitude difference comparator 80 and a loop filter 62. This point is different from the demodulation apparatus 10 according to the first embodiment. Further, the structure of a skew detector 90 is different from the structure of the skew detector 30. The same reference numerals in FIG. 4 are given to the corresponding components to those of the demodulation apparatus 10, and the explanation thereof is omitted.

Figure 10:
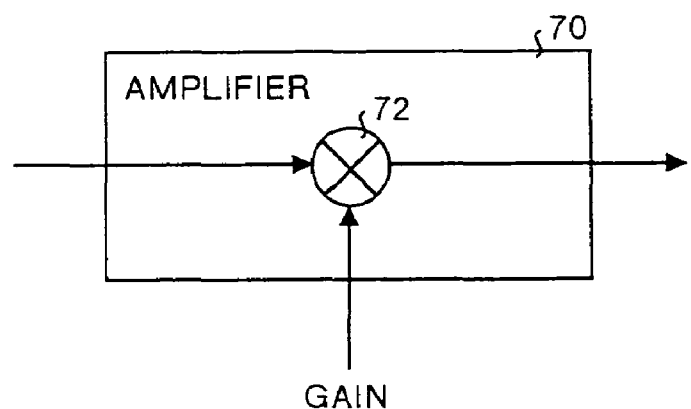
FIG. 10 is a block diagram showing a schematic structure of an amplifier of the demodulation apparatus according to the second embodiment.

In the demodulation apparatus 60 according to the second embodiment, the amplifier 70 amplifies the Q channel sample signal output from the A/D converter 132 based on a gain showing a signal output from the loop filter 62, mentioned later. FIG. 10 is a block diagram showing a schematic structure of the amplifier of the demodulation apparatus according to the second embodiment. As shown in FIG. 10, the amplifier 70 inputs a signal to be amplified and the signal showing gain into a multiplication section 72. The amplifier 70 amplifies the signal according to the gain, and this is used for general purpose.

Figure 11:
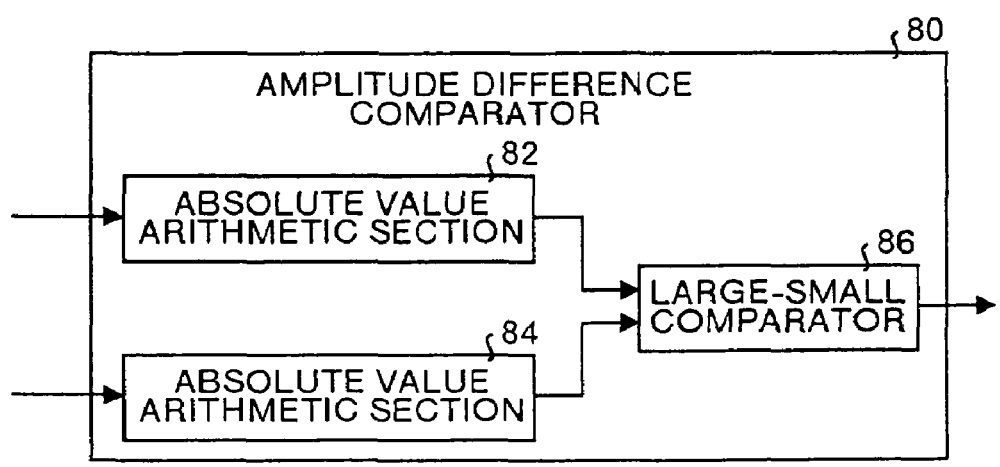
FIG. 11 is a block diagram showing a schematic structure of an amplitude difference comparator of the demodulation apparatus according to the second embodiment.

The amplitude difference comparator 80 compares the I channel sample signal output from the A/D converter 131 with the Q channel sample signal which has passed through the amplifier 70 and has been amplified. The comparator 80 outputs a signal according to their large-small relationship and a difference. FIG. 11 is a block diagram showing a schematic structure of the amplitude difference comparator of the demodulation apparatus according to the second embodiment. As shown in FIG. 11, the amplitude difference comparator 80 is composed of two absolute value arithmetic sections 82 and 84 and a large-small comparator 86.

The absolute value arithmetic section 82 calculates an intermediate value of a plurality of sample signals forming a waveform of the signal on the I channel side. It calculates an absolute value of a difference between the intermediate value and an instantaneous value of the I channel sample signal. Further, similarly the absolute value arithmetic section 84 calculates an absolute value of a difference between an intermediate value of the I channel sample signals and an instantaneous value of the Q channel sample signal.

Further, the large-small comparator 86 inputs the absolute value signals output from the absolute value arithmetic sections 82 and 84 thereinto and calculates their difference. For example, when the absolute value on the Q channel side is larger than the absolute value on the I channel side, their difference is output as a minus value. On the contrary, when the absolute value on the Q channel side is smaller than the absolute value on the I channel side, their difference is output as a plus value.

The loop filter 62 smoothes the output of the large-small comparator 86, namely, the output of the amplitude difference comparator 80. The loop filter 62 inputs the smoothed result as a control signal which can change the gain into the amplifier 70. Thus, the feedback loop is formed, and the maximum values of the I and Q channel sample signals output from the A/D converters 131 and 132, that is the amplitudes of the I and Q channel signal waveforms, converge so as to be equal with each other.

Figure 12:
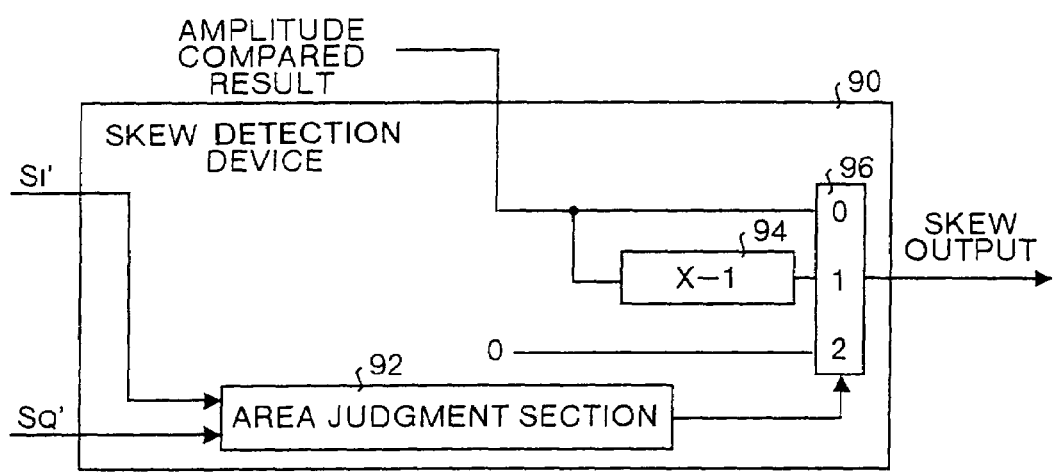
FIG. 12 is a block diagram showing a schematic structure of the skew detector of the demodulation apparatus according to the second embodiment.

Further, the skew detector 30 explained in the first embodiment is replaced by the skew detector 90, however the structures are different from each other partially. FIG. 12 is a block diagram showing a schematic structure of the skew detector of the demodulation apparatus according to the second embodiment. In FIG. 12, an area judgment section 92, a signal inversion section 94 and a selector 96 correspond respectively to the area judgment section 32, the signal inversion section 34 and the selector 35 shown in FIG. 6. Their operations are the same. The skew detector 90 is different from the skew detector 30 shown in FIG. 6 in that the amplitude compared result output from the amplitude comparator 136 is utilized as the amplitude compared result which is generated by the structure composed of the amplitude arithmetic section 31, the addition section 33 and the signal showing the reference amplitude in FIG. 6.

In other words, the skew detector 90 inputs the amplitude compared result output from the amplitude comparator 136 into the signal inversion section 94 and the selector 96. Therefore, the circuit configuration can be simplified somewhat.

There will be explained below an operation of the demodulation apparatus 60. The explanation is omitted for the flow of the signal flow via the overlapped structure of the first embodiment as it is mentioned above. Therefore, an operation of the feedback loop circuit composed of the amplifier 70, the amplitude difference comparator 80 and the loop filter 62 will be mainly explained.

In FIG. 9, when the gains of the amplifiers 117 and 119 of the semi synchronous orthogonal detection circuit 110 are different from each other, the maximum values of the sample values output from the A/D converters 131 and 132 are inclined. Therefore, the amplitude difference comparator 80 continues to compare the I channel sample signal and the Q channel sample signal per suitable timing. The amplitude difference comparator 80 detects an amplitude difference and inputs a signal according to the amplitude difference into the amplifier 70, which amplifies the Q channel sample value, via the loop filter 62.

As a result, the Q channel sample signal to be input into the timing reproduction circuit 134 is adjusted. The maximum values of the I channel sample signal and the Q channel sample signal, that is the amplitudes of the I and Q channel signal waveforms, can be equal to each other by the function of the feedback loop. Even if the values of the symbol amplitudes calculated from the I and Q channel sample signals become large due to the amplitude adjustment, the amplitude is adjusted in order to make them close to the reference amplitude by the amplitude comparator 136 at the later stage. Therefore, problems are not caused.

The amplifier 70 may be provided on the output side of the A/D converter 131 so that the I channel sample signal is adjusted.

In the demodulation apparatus 60 according to the second embodiment, the Q channel sample value output from the A/D converter 132 is adjusted by the feedback loop circuit composed of the amplifier 70, the amplitude difference comparator 80 and the loop filter 62. Thus, the Q channel sample value becomes equal to the I channel sample value output from the A/D converter 131. Therefore, the skew which occurs due to a difference in the gains between the amplifiers 117 and 119 can be corrected, and the satisfactory modulation characteristic can be obtained.

According to one aspect of the invention, at the previous stage of the carrier reproduction circuit, the feedback loop circuit composed of the skew correction device, the skew detector, the loop filter and the sine-wave generator is provided. Thus, the skew on the Q channel signal side, which occurs in the phase shifter required for the orthogonal phase detection, is detected. Further, the signal where the detected skew has been corrected can be obtained. The corrected result is input into the carrier reproduction circuit so that the influence of the skew can be eliminated in the process by the carrier reproduction circuit and the processes thereafter. Therefore, the demodulation characteristic of the I and Q channel signals is prevented from being deteriorated, and the satisfactory demodulation becomes possible.

According to another aspect of the present invention, at the previous stage of the timing reproduction circuit, the feedback loop circuit composed of the amplifier, the amplitude difference comparator and the loop filter is provided. The feedback loop circuit adjusts one of the levels of the signals on the I and Q channel sides such as the I and Q channel sample values output from the A/D converter. Thus, both the signals become equal to each other. Even if the gains are different in the amplifiers which individually amplify the signals on the I and Q channel sides just after the orthogonal phase detection, the influence of the skew which is caused by the gain difference can be eliminated in the process by the timing reproduction circuit and the processes thereafter. Therefore, the demodulation characteristic of the I and Q channel signals are prevented from being deteriorated, and the more satisfactory demodulation becomes possible.

Further, the comparatively simple feedback loop circuit is provided so that the amplitude skew due to the orthogonal skew and the amplitude gain which is caused by the phase delay can be corrected. Therefore, a complicated circuit such as an equalizer circuit is not required, and the cost can be reduced.

Although the invention has been described with respect to a specific embodiment for a complete and clear disclosure, the appended claims are not to be thus limited but are to be construed as embodying all modifications and alternative constructions that may occur to one skilled in the art which fairly fall within the basic teaching herein set forth.

The invention claimed is:

1. A demodulation method comprising:
    an orthogonal detection step of detecting an I channel signal and a Q channel signal from a PSK modulated signal;
    an amplitude difference comparison step of calculating a difference between the I channel signal and the Q channel signal to be inputted into a timing reproduction circuit;
    an amplification step of amplifying either signal of the I channel signal or the Q channel signal by means of a gain based on the difference calculated at the amplitude difference comparison step; and
    an extracting step of extracting a signal at timing in synchronization with a base band signal based on the I channel signal or the Q channel signal amplified by the amplification step and the I channel or the Q channel not amplified by the amplification step.

2. The demodulation method according to claim 1, further comprising:
    a skew detection step of detecting an orthogonal skew from a first signal on the I channel side and a second signal on the Q channel side to be inputted into a carrier reproduction circuit; and
    a skew correction step of correcting one of the first signal and the second signal based on the orthogonal skew and outputting the corrected signal to the carrier reproduction circuit.

3. A demodulation method according to claim 1, wherein the skew detection step comprises calculating symbol amplitudes from the first signal on the I channel side and the second signal on the Q channel side so as to output difference between the calculated symbol amplitudes and a predetermined reference amplitude as the orthogonal skew.

4. A demodulation method according to claim 1, further comprising:

a sine wave generation step of generating a plurality of orthogonal sine waves based on the orthogonal skew.

5. A demodulation method according to claim 1, wherein the skew correction step comprises multiplying the first signal and a first skew correcting coefficient determined based on the orthogonal skew so as to obtain a first multiplied result, and multiplying the second signal and a second skew correcting coefficient determined based on the orthogonal skew so as to obtain a second multiplied result, and inputting a result obtained by adding the first multiplied result to the second multiplied result into said carrier reproduction circuit.

6. A demodulation method according to claim 4, wherein the skew correction step comprises multiplying a first skew correcting coefficient determined based on one of the plurality of orthogonal sine waves and the first signal so as to obtain a first multiplied result, and multiplying a second skew correcting coefficient determined based on another one of the plurality of orthogonal sine waves and the second signal so as to obtain a second multiplied result, and inputting a result obtained by adding the first multiplied result to the second multiplied result as new second signal into said carrier reproduction circuit.

7. A demodulation method according to claim 4, wherein the carrier reproduction unit extracts said I channel signal and said Q channel signal from the corrected signal and the other of the first signal and the second signal not corrected in the skew correction step.

8. The demodulation method according to claim 1, further comprising:

receiving said PSK modulated signal;

detecting an orthogonal skew between a first on the I channel signal and a second signal on the Q channel derived from the PSK modulated signal; and correcting one of the first signal and the second signal based on the orthogonal skew.

9. A demodulation apparatus comprising:

an A/D conversion unit which converts an I channel signal and a Q channel signal, which are obtained from a PSK modulated signal by orthogonal detection, into digital signals so as to output sample signals of both the digital signals;

a timing reproduction unit which extracts the sample signals of the I channel signal and the Q channel signal outputted from said A/D conversion unit with timing in synchronization with a base band signal so as to output sample signals;

an amplitude difference comparison unit which calculates a difference between the I channel signal and the Q channel signal;

a filter unit which smoothes a signal representing the difference calculated in said amplitude difference comparison unit; and an amplification unit which amplifies either signal of the I channel signal or the Q channel signal by a gain according to the signal outputted from said filter unit, wherein the timing reproduction unit extracts the sample signals at timing in synchronization with the base band signal based on the I channel signal or the amplified Q channel signal amplified by the amplification unit and the I channel or the Q channel not amplified by the amplification unit.

10. A demodulation apparatus comprising:

an orthogonal detector for detecting an I channel signal and a Q channel signal from a PSK modulated signal;

an amplitude difference comparator for calculating a difference between the I channel signal and the Q channel signal to be inputted into a carrier reproduction circuit;

an amplifier for amplifying either the I channel signal or the Q channel signal by means of a gain based on the difference; and a timing reproduction unit for extracting a signal at timing in synchronization with a base band signal based on the I channel signal or the Q channel signal amplified by the amplifier and the I channel or the Q channel not amplified by the amplifier.

11. The demodulation apparatus according to claim 10, further comprising:

a skew detection unit for detecting an orthogonal skew from a first signal on the I channel side and a second signal on the Q channel side to be inputted into a carrier reproduction circuit; and a skew correction unit for correcting one of the first signal and the second signal based on the orthogonal skew and outputting the corrected signal to the carrier reproduction circuit.

12. The demodulation apparatus accordingly to claim 11;

wherein said skew detection unit includes an area judgment unit which judges a position in an IQ space of a symbol amplitude of the first signal and the second signal.

13. A demodulation apparatus according to claim 11, wherein the skew detection unit calculates symbol amplitudes represented by the first signal and the second signal so as to output a difference between the calculated symbol amplitudes and a predetermined reference amplitude as said orthogonal skew.

14. A demodulation apparatus according to claim 11, further comprising:

a sine wave generation unit which generates a plurality of orthogonal sine waves based on the orthogonal skew.

15. A demodulation apparatus according to claim 11, wherein the skew correction unit multiplies the first signal and a first skew correcting coefficient determined based on the orthogonal skew so as to obtain a first multiplied result, and multiplying the second signal and a second skew correcting coefficient determined based on the orthogonal skew so as to obtain a second multiplied result, and inputting a result obtained by adding the first multiplied result to the second multiplied result into said carrier reproduction circuit.

16. A demodulation method comprising:

an orthogonal detection step of detecting an I channel signal and a Q channel signal from a PSK modulated signal;

an amplification step of amplifying either the I channel signal or the Q channel signal;

an amplitude difference comparison step of calculating a difference between an amplified I channel signal and the Q channel signal or between the I channel signal and an amplified Q channel signal; and an extracting step of extracting a signal at timing in synchronization with a base band signal based on either the amplified I channel signal and the Q channel signal or the I channel signal and the amplified Q channel signal, wherein the amplification step uses a gain difference calculated by the amplitude difference comparison step.

* * * * *